United States Patent
Kono et al.

(10) Patent No.: US 7,256,701 B2
(45) Date of Patent: Aug. 14, 2007

(54) MOTOR DRIVER

(75) Inventors: Shinichi Kono, Yamanashi (JP);
Shinichi Horikoshi, Yamanashi (JP);
Masami Kimijima, Yamanashi (JP);
Mamoru Yaeshima, Kanagawa (JP)

(73) Assignee: Fanuc Ltd, Yamanashi (JP)

( * ) Notice: Subject to any disclaimer, the term of this patent is extended or adjusted under 35 U.S.C. 154(b) by 224 days.

(21) Appl. No.: 10/905,434

(22) Filed: Jan. 4, 2005

(65) Prior Publication Data

US 2005/0151658 A1 Jul. 14, 2005

(30) Foreign Application Priority Data

Jan. 13, 2004 (JP) ............... 2004-005605

(51) Int. Cl.
*G08B 21/00* (2006.01)
(52) U.S. Cl. .................. 340/648; 340/635; 324/551
(58) Field of Classification Search ............... 340/648, 340/647, 635, 636.12; 324/551, 557, 541; 318/490, 806
See application file for complete search history.

(56) References Cited

U.S. PATENT DOCUMENTS

| | | | |
|---|---|---|---|
| 4,737,775 A | * | 4/1988 | Tokuda et al. ............ 340/647 |
| 4,766,387 A | * | 8/1988 | Browne et al. ............ 324/545 |
| 5,019,760 A | * | 5/1991 | Chu et al. ............... 318/490 |
| 6,087,836 A | * | 7/2000 | Divljakovic et al. ....... 324/557 |
| 6,593,751 B2 | * | 7/2003 | Takahashi ............... 324/551 |

FOREIGN PATENT DOCUMENTS

| | | |
|---|---|---|
| EP | 0 780 960 A1 | 6/1997 |
| JP | 3-195393 | 8/1991 |
| JP | 10-210649 | 1/1997 |
| JP | 2001-141795 | 11/1999 |
| JP | 2002-267712 | 9/2002 |

OTHER PUBLICATIONS

European Search Report.

* cited by examiner

*Primary Examiner*—Phung T. Nguyen
(74) *Attorney, Agent, or Firm*—Drinker Biddle & Reath LLP

(57) ABSTRACT

A motor driver capable of detecting the insulation deterioration of a motor easily and inexpensively is disclosed. The voltage supplied from an AC power supply (1) is rectified by a first rectifying circuit (D1 to D6) and smoothed by a capacitor (C) in a power supply unit (6). The output voltage of the power supply unit (6) is converted into an AC voltage of a frequency and a motor (M) is driven by a motor drive amplifier (8). Elements (R1, C2, R11, C21) are connected between at least one of the positive electrode (4) and the negative electrode (5) of the output line (4, 5) of the power supply unit (6) and the ground (G2, G4). An insulation deterioration circuit (10, 11, 12) detects at least one of the voltage between the elements and the current flowing through the elements.

22 Claims, 5 Drawing Sheets

MOTOR DRIVER

BACKGROUND OF THE INVENTION

1. Field of the Invention

The present invention relates to a motor driver capable of detecting insulation deterioration in the motor in a motor drive system for driving the motor using a motor drive amplifier such as a voltage-type inverter or a PWM inverter.

2. Description of the Related Art

The protracted use of a motor deteriorates the motor insulation in accordance with the environment in which it is operated. The leakage current due to the insulation deterioration activates a leakage interrupter, so that the apparatus using the motor may suddenly stop. In such case, it is not clear whether the motor or the driver is a problem, and a considerable time is consumed to trace the cause of the fault. The period during which a system or production line using the motor is suspended tends to be undesirably lengthened.

It has been common practice to detect the insulation deterioration of the motor by detecting the leakage current as described above. The leakage current detector, however, can detect the leakage current only after it reaches some magnitude. Thus, the leakage current is often detected only after the insulation deterioration of the motor has progressed considerably. As the sudden stoppage of the system or apparatus is due to the leakage current, the jobs on the whole apparatus or whole system of the production line, etc. must be suspended to investigate whether the stopping of the apparatus or the system is caused by the motor itself or the motor driver or the peripheral devices. Another problem is that the leakage current detector cannot contribute to the prediction and the preventive maintenance against the insulation deterioration of the motor.

A method of preventing the inoperability of an air conditioning system by discovering the insulation deterioration of the motor of a compressor at an early time has been proposed (Japanese Unexamined Patent Publication No. 2001-141795). In this method, while the motor is stopped, a DC voltage is converted into an arbitrary voltage and frequency and a high-frequency pulse is applied to drive a transistor of the power converter for driving the motor, a DC voltage (or a preset voltage) obtained by rectifying and filtering the three-phase AC power and the motor current are detected, and based on the DC voltage and the motor current thus detected, the insulation resistance is calculated, and an alarm is issued whenever the insulation resistance value decreases to below the set insulation resistance value.

An invention for preventing the malfunction of the leakage interrupter is in the public domain (Japanese Unexamined Patent Publication No. 10-210649), in which, in order to prevent the malfunction of the leakage current interrupter caused by the leakage current flowing through the wiring between the inverter and the motor and the stray capacitance between the conductive portion and the ground in the motor when an inverter is switched at high frequency in the motor driven by a voltage-type inverter, a DC reactor is inserted on the positive and negative lines connecting the rectifier and the inverter, the positive and negative lines are grounded through a series circuit of a capacitor and a resistor, and the zero-phase current generated by the inverter operation flows through a closed circuit of the stray capacitance, the grounding capacitor, a resistor and the positive and negative lines.

SUMMARY OF THE INVENTION

The leakage current detector used to detect the insulation deterioration of the motor can detect the insulation deterioration only after the deterioration has progressed to a considerable degree. Whenever the operation stops suddenly due to the current leakage, the jobs on the whole system of the apparatus or the production line are suspended to check whether the stoppage is caused by the motor itself or the motor driver or other peripheral devices or otherwise to trace the cause of the stoppage. Also, this leakage current detector cannot contribute to the prediction and preventive maintenance against the insulation deterioration of the motor.

The method described in Japanese Unexamined Patent Publication No. 2001-141795, on the other hand, can contribute to the prediction of, and preventive maintenance against, insulation deterioration of the motor. Nevertheless, the voltage and the current are required to be detected. In addition, the current is required to be detected on the current line directly flowing in the motor by turning on a transistor of the power converter. Although the current detected is small in value, the detector requires protection against a large current, thereby increasing the cost. Also, the insulation deterioration of the motor cannot be measured without stopping the motor.

Accordingly, the object of this invention is to provide an inexpensive motor driver capable of predicting the insulation deterioration of the motor.

According to a first aspect of the invention, there is provided a motor driver comprising a power supply unit including a first rectifying circuit for rectifying the voltage supplied from an AC power supply and a capacitor for smoothing the rectified voltage, a motor drive amplifier for driving the motor by converting the output voltage of the power supply unit into an AC voltage of a frequency to drive the motor, a plurality of elements connected between at least one of the positive and negative electrodes of the output line of the power supply unit and the ground, and an insulation deterioration detecting circuit for detecting at least one of the voltage between the elements and the current flowing in the elements.

According to a second aspect of the invention, there is provided a motor driver, wherein the elements are each configured of a capacitor and a resistor connected in series with each other, and the insulation deterioration detecting circuit is a voltage detecting circuit for detecting the voltage across the resistor.

According to a third aspect of the invention, there is provided a motor driver, wherein the elements include a series circuit of a capacitor and a current sensor for detecting the voltage proportional to the current flowing in the capacitor, and the insulation deterioration detecting circuit is a voltage detecting circuit for detecting the output voltage of the current sensor.

According to a fourth aspect of the invention, there is provided a motor driver, wherein the voltage detecting circuit includes a comparator for comparing the detected voltage with a reference voltage, and a fault is displayed on a display unit in the case where the detected voltage exceeds the reference voltage.

According to a fifth aspect of the invention, there is provided a motor driver, wherein the voltage detecting circuit includes a second rectifying circuit for converting the detected voltage to a DC voltage with respect to the ground and a comparator for comparing the output voltage of the second rectifying circuit with a reference voltage, and a fault is displayed on a display unit in the case where the output voltage of the second rectifying circuit exceeds the reference voltage.

According to a sixth aspect of the invention, there is provided a motor driver, wherein the voltage detecting circuit includes an A/D converter for converting the detected voltage into a digital signal and a processor causing the display unit to display a fault in the case where the voltage converted by the A/D converter exceeds a predetermined value.

According to a seventh aspect of the invention, there is provided a motor driver, wherein the voltage detecting circuit includes a second rectifying circuit for converting the detected voltage into a DC voltage with respect to the ground, an A/D converter for converting the detected voltage into a digital signal and a processor causing the display unit to display a fault in the case where the voltage converted by the A/D converter exceeds a predetermined value.

According to an eighth aspect of the invention, there is provided a motor driver, wherein the voltage detecting circuit includes a memory for storing the detected voltage, and the processor causes the display unit to display a plurality of detected voltage values stored in the memory.

According to a ninth aspect of the invention, there is provided a motor driver, wherein the memory stores a reference voltage value for at least one of the motor specification and the motor drive amplifier and the processor causes the display unit to display a fault in the case where the detected voltage value exceeds the reference voltage value.

According to a tenth aspect of the invention, there is provided a motor driver, wherein the memory stores the detected voltage value output from the A/D converter free of insulation deterioration in the motor driver and the motor as a first reference value and the voltage value detected with the insulation deterioration of the motor driver and the motor as a second reference value, the processor causing the display unit to display a fault in the case where the difference between the voltage value output from the A/D converter and the first reference value exceeds the second reference value.

DESCRIPTION OF THE PREFERRED EMBODIMENTS

The most preferred embodiments of the invention are described below with reference to the accompanying drawings.

Figure 1:
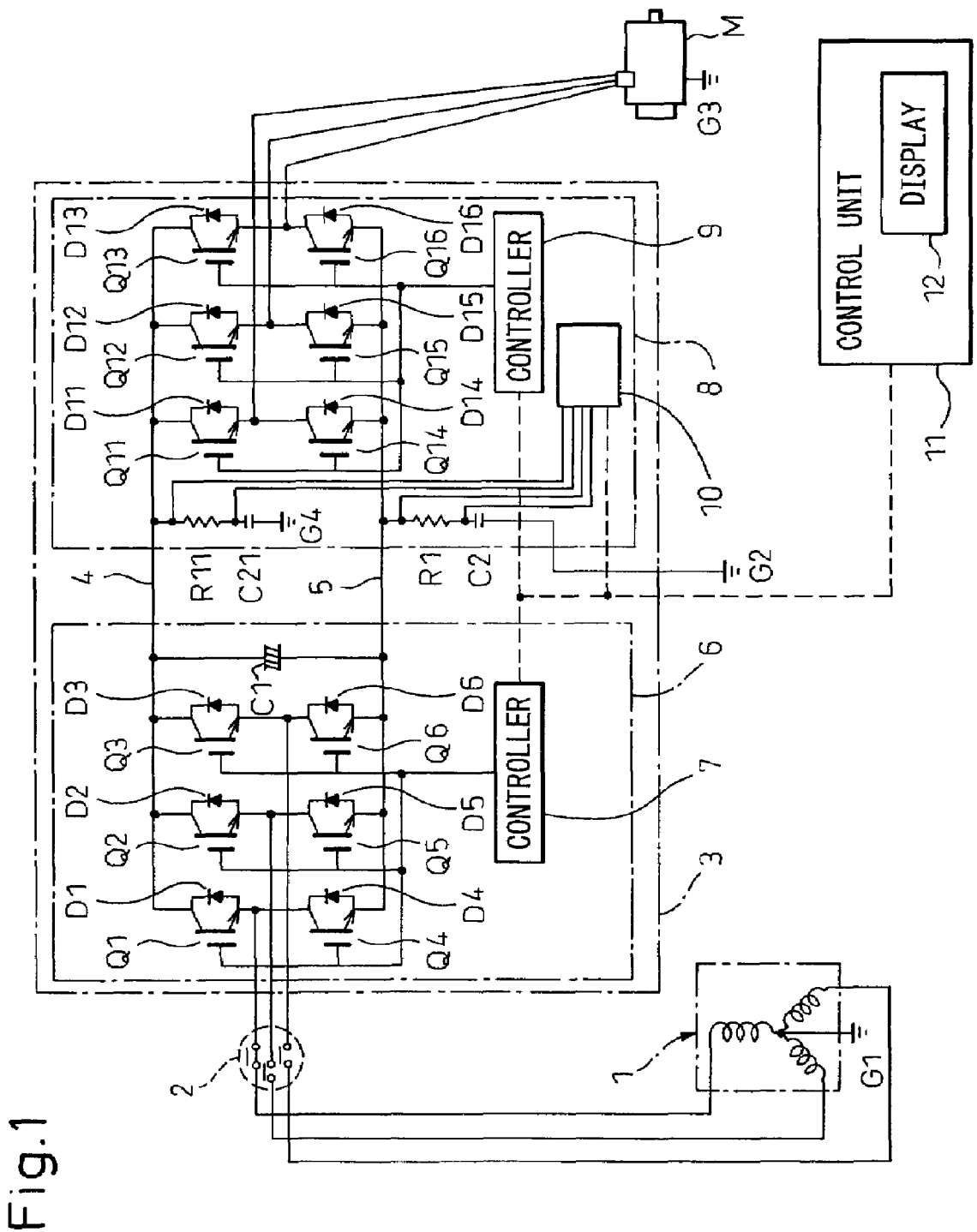
FIG. 1 is a circuit diagram showing a block diagram of the essential parts of a motor driver according to an embodiment of the invention.

FIG. 1 is a circuit diagram showing a block diagram of the essential parts according to an embodiment of the invention.

Reference numeral 1 designates a three-phase AC power supply connected to the ground. Numeral 2 designates a contact point of an electromagnetic contactor controlled by a control unit 11. Numeral 3 designates a motor driver body including a power supply unit 6 for converting the three-phase AC power supply into a DC power supply through a rectifying circuit and a motor drive amplifier 8 for converting the DC power supply into an arbitrary AC power supply and driving a motor M.

The power supply unit 6 includes a rectifying circuit having diodes D1 to D6 for rectifying the three-phase DC power supply 1 into a DC power supply, a plurality of switching elements Q1 to Q6 connected in parallel to the diodes D1 to D6 and having an insulated gate bipolar transistor (IGBT) for feeding back the regeneration circuit to the AC power supply, and a smoothing capacitor C1 for smoothing the DC output rectified by the rectifying circuit of the diodes D1 to D6. The voltage across the smoothing capacitor C is output to the output line (DC link) of the power rectifying circuit on the positive line 4 and the negative line 5. The controller 7 detects the regeneration start voltage, and the switching elements Q1 to Q6 are turned on/off thereby to feed back the regeneration current to the AC power supply.

The motor drive amplifier 8 is configured of an inverter circuit having the switching elements Q11 to Q16 of IGBT and the diodes D11 to D16 connected in parallel to the switching elements Q11 to Q16, respectively, and a controller 9.

The controllers 7, 9 of the power supply unit 6 and the motor drive amplifier 8 are connected to the control unit 11, for controlling the motor driver, providing a numerically controlled unit and, in response to an instruction from the control unit 11, the controller 9 turns on/of the switching elements Q11 to Q16 thereby to control the drive of the motor M.

The aforementioned configuration of the motor driver body 3 remains the same as that of the conventional motor driver. This invention is different in that a motor insulation deterioration detection means for detecting the insulation deterioration of the motor is added to the conventional motor driver.

According to this embodiment, the motor insulation deterioration detection means is constituted of a detecting circuit 10 for detecting the voltage across the resistor R1, with the negative output line 5 of the DC link of the rectifying circuit of the power supply unit 6 grounded to G2 through a series circuit including a resistor R1 and a capacitor C2. In a similar fashion, the positive output line 4 of the DC link of the power rectifying circuit is grounded at G4 through the series circuit of a resistor R11 and a capacitor C21, and the voltage across the resistor R11 is also detected by the detecting circuit 10. The motor driver may include at least one of the series circuit of the resistor R1 and the capacitor C2 and the series circuit of the resistor R11 and the capacitor C21. The provision of both series circuits, however, makes it possible to detect the insulation deterioration of the motor more positively. The description that follows assumes only the series circuit of the resistor R1 and the capacitor C2. The detecting circuit 10 and the control unit 11 are connected to each other.

The electromagnetic contactor is activated by the control unit 11 and the contact 2 thereof is turned on. At the same time, power is supplied to the motor driver 3, the three-phase AC power supply is rectified by the rectifying circuit of the power supply unit 6 into a DC power supply. The DC power is supplied to the inverter of the motor drive amplifier 8 through lines 4, 5 of the DC link unit, and the switching elements Q11 to Q16 of the inverter are controlled by the controller 9 and operate at a high switching speed (several KHz to ten and several KHz). The DC power is thus converted into an AC signal of an arbitrary frequency to drive the motor M. In the process, the impedance and the stray capacitance of the wiring and other factors cause noises of a frequency higher than the switching frequency and the surge noise due to the reflection attributable to the impedance mismatch between the motor and the power feed line to the motor. These noises are hereinafter collectively called high-frequency noise.

The high-frequency noise flows into the ground G3 through the insulation resistance of the motor M with respect to the ground. As a result, what is called a high-frequency leakage current flows.

The high-frequency leakage current is derived from the DC power of the DC link. In the case where the impedance of the capacitor C2 and the resistor R1 between the negative line 5 of the DC link and the ground G2 is sufficiently low as compared with the impedance of the three-phase AC power supply 1, therefore, this high-frequency leakage current is not returned to the three-phase AC power supply 1 but to the DC link through the capacitor C2 and the resistor R1. As a result, the high-frequency leakage current to the ground G1 of the three-phase AC power supply 1 is greatly reduced.

The insulation resistance of the motor M with respect to the ground has a certain life, and the protracted use of the motor M reduces the insulation resistance. Also, the motor winding may be damaged by the environment in which the motor is operated, resulting in a sharp decrease in the insulation resistance. The reduced insulation resistance increases the high-frequency noise flowing to the ground, and so does the high-frequency current flowing in the resistor R1 and the capacitor C2. Thus, the insulation deterioration of the motor can be detected by measuring, with the detecting circuit 10, the voltage across the resistor R1 generated by the current flowing in the circuit of the resistor R1 and the capacitor C2.

Figure 2:
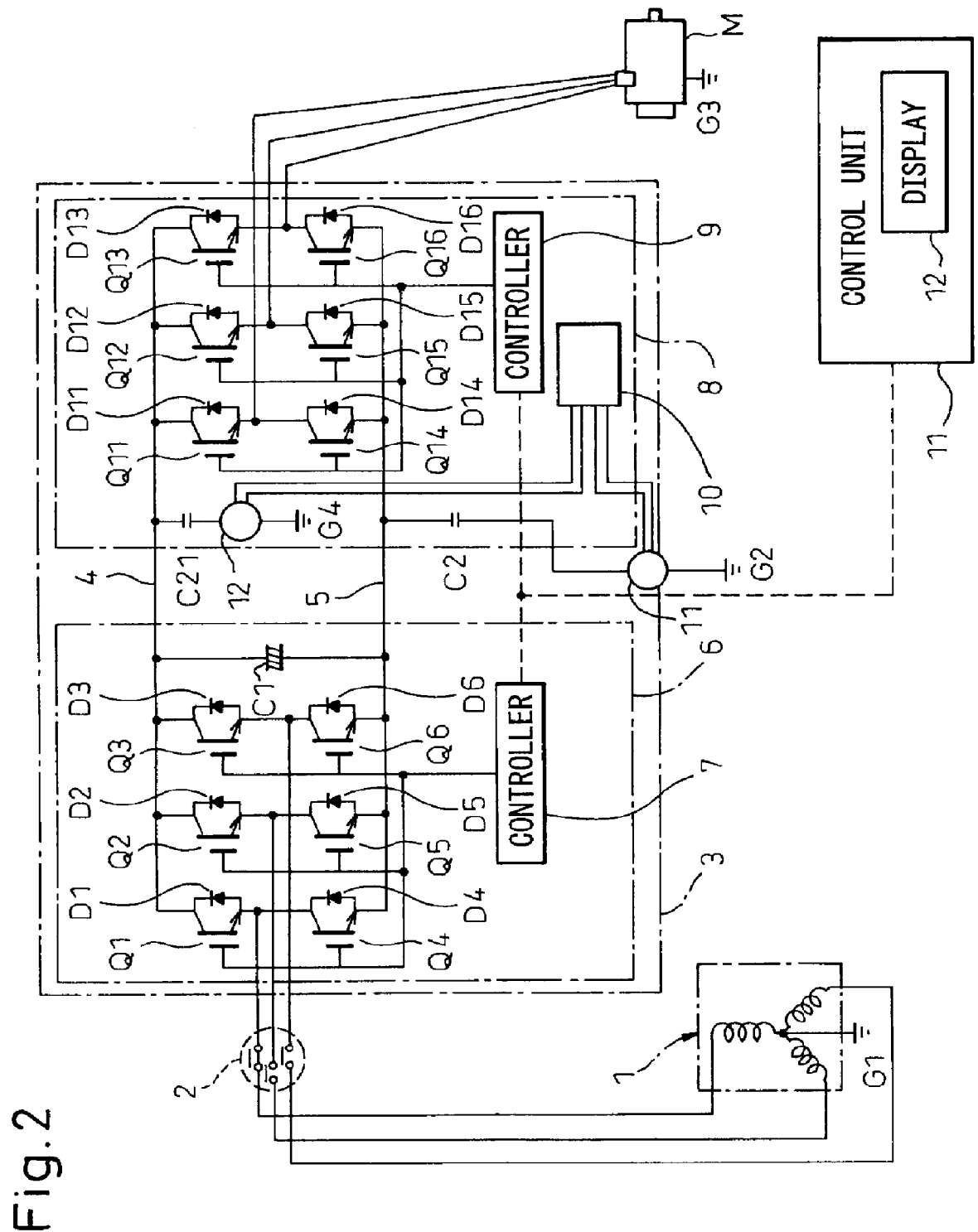
FIG. 2 is a block diagram showing the essential parts of a motor driver according to another embodiment of the invention.

FIG. 2 is a block diagram showing the essential parts of the motor driver according to another embodiment of the invention. In FIG. 2, the difference from FIG. 1 lies in that the series circuit of the resistor R1 and the capacitor C2 and the series circuit of the resistor R11 and the capacitor C21 in FIG. 1 are replaced by the series circuit of the capacitor C2 and the current sensor 11 inserted between the ground G2 and the negative output line 5 of the rectifying circuit of the power supply unit 6 and the series circuit of the capacitor C21 and the current sensor 12 inserted between the ground G4 and the positive output line 4 of the rectifying circuit. The current sensors 11, 12 detect a voltage proportional to the magnitude of the current flowing therein and output it to the detecting circuit 10. The detecting circuit 10 measures this voltage and thus detects the insulation deterioration of the motor.

Figure 3:
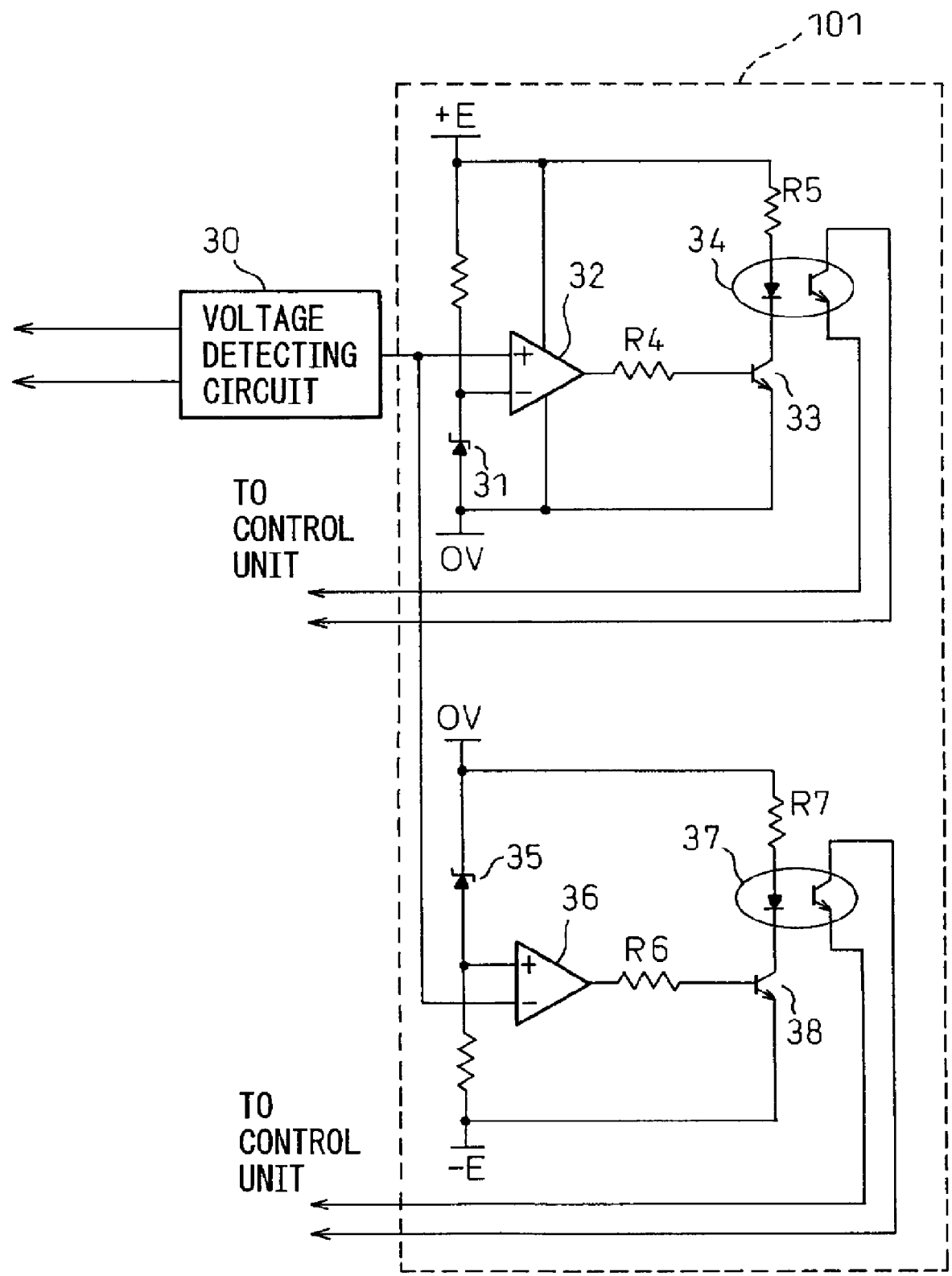
FIG. 3 shows an example of the circuit diagram of a detecting circuit according to the embodiment of FIG. 1 or 2.

FIG. 3 shows an example of the circuit diagram of the detecting circuit 10 according to the embodiment shown in FIG. 1 or 2.

In the detecting circuit 101 shown in FIG. 3, the amplitude of the AC voltage generated across the resistor R1 included in the series circuit of the resistor R1 and the capacitor C2 inserted between the negative line 5 of the DC link and the ground G2 is detected by the voltage detecting circuit 30. The output of the voltage detecting circuit 30 is input to the positive terminal of the comparator 32 on the one hand and to the negative terminal of the comparator 36 on the other hand. The negative terminal of the comparator 32 is supplied with a reference voltage determined by the zener diode 31, while the positive terminal of the comparator 36 is supplied with a reference voltage determined by the zener diode 35. Once the detected positive voltage increases beyond the reference voltage, the transistor 33 is turned on by the signal output from the comparator 32. When the detected negative voltage drops below the reference voltage, on the other hand, the transistor 38 is turned on by the signal output from the comparator 36. The transistor 33 is connected in series with the light-emitting element of the photocoupler 34. By turning on the transistor 33, a current flows in the light-emitting element of the photocoupler 34, so that the signal from the light-emitting element of the photocoupler 34 is output as a fault detection signal to the control unit 11. In similar fashion, the transistor 38 is connected in series with the light-emitting element of the photocoupler 37. When the transistor 38 turns on, a current flows in the light-emitting element of the photocoupler 37, and the signal from the light-emitting element of the photocoupler 37 is output as a fault detection signal to the control unit 11.

Once a reference voltage is set by the zener diodes 31, 35, therefore, the insulation resistance of the motor drops and the high-frequency leakage current flowing in the resistor R1 and the capacitor C2 increases. When the voltage across the resistor R1 increases to or beyond the reference voltage, an output signal is produced from the photocoupler 34 or 37 thereby to detect that the motor insulation resistance has reached a predetermined value.

The drop in insulation resistance can be detected while the motor is driven, and therefore the motor is not required to be stopped to detect the insulation deterioration. When the insulation resistance is reduced to a predetermined value or less while the motor is driven, the control unit 11 is notified. Based on this notification, a display unit 12, etc. of the control unit 11 informs that the insulation of the motor has deteriorated.

Figure 4:
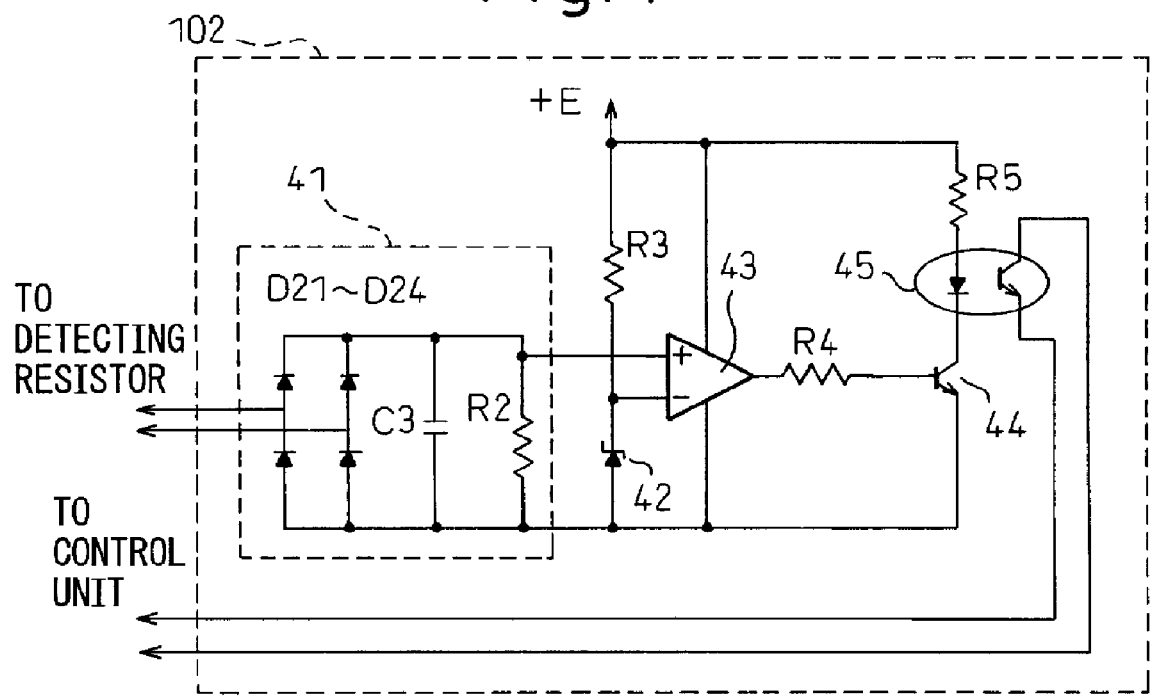
FIG. 4 shows another example of the circuit diagram of a detecting circuit according to the embodiment of FIG. 1 or 2.

FIG. 4 shows still another example of the circuit diagram of the detecting circuit 10 according to the embodiment shown in FIG. 1 or 2.

In the detecting circuit 102 shown in FIG. 4, numeral 41 designates a rectifying circuit including diodes D21 to D24, a capacitor C3 and a resistor R2. Also, numerals R3 to R5 designate resistors, numeral C2 a capacitor, numeral 42 a zener diode, numeral 43 a comparator, numeral 44 a transistor and numeral 45 a photocoupler.

The AC voltage across the resistor R1 in the series circuit of the resistor R1 and the capacitor C2 inserted between the ground G2 and the negative line 5 of the DC link is input to the rectifying circuit 41, rectified by the diodes D21 to D24 and smoothed by the capacitor C3 into a smooth DC current, so that a DC voltage is generated across the resistor R2. This DC voltage is input to one terminal of the comparator 43. The other terminal of the comparator 43 is supplied with the reference voltage determined by the zener diode 42. When the detected DC voltage increases beyond the reference voltage, the transistor 44 is turned on by the signal output from the comparator 43. The transistor 44 is connected in series with the light-emitting element of the photocoupler

45. When the transistor 44 turns on, a current flows in the light-emitting element of the photocoupler 25, and the output signal from the light-emitting element of the photocoupler 45 is applied as a fault detection signal to the control unit 11.

Once a reference voltage is set by the zener diode 42, therefore, an output signal is produced from the photocoupler 45 when with the decrease in the motor insulation resistance, the high-frequency leakage current flowing in the resistor R1 and the capacitor C2 increases and the DC voltage obtained by rectifying the high-frequency current in the rectifying circuit 41 of the detecting circuit 10 increases to or beyond the reference voltage, thereby detecting that the insulation resistance of the motor has reached a predetermined value.

This insulation resistance decrease can be detected when the motor is driven, and therefore, the motor is not required to be stopped to detect the insulation deterioration. In the case where the insulation resistance decreases to or below a predetermined value while the motor is driven, therefore, the control unit 11 is notified, and based on this notification, the fact that the motor insulation has decreased is notified on the display unit 12, etc. of the control unit 11.

Figure 5:
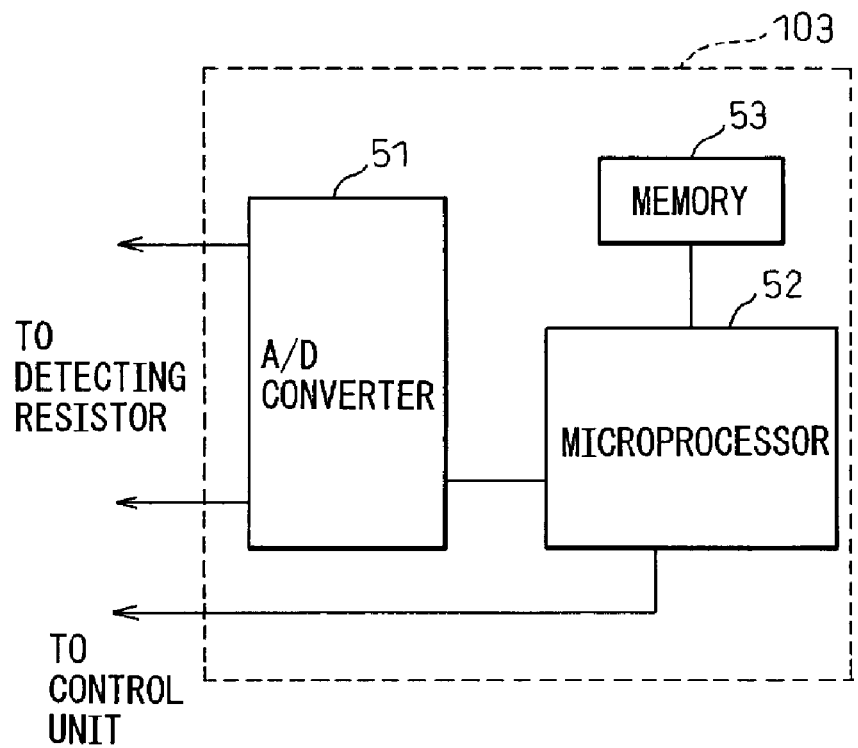
FIG. 5 shows still another example of the circuit diagram of a detecting circuit according to the embodiment of FIG. 1 or 2.

FIG. 5 is a block diagram showing the detecting circuit 10 according to another embodiment of the invention. The motor insulation deterioration is detected by using the detecting circuit 103 of FIG. 5 as the detecting circuit 10. Especially, the insulation deterioration can be detected in accordance with the trend of insulation deterioration or the specification (type) of the motor drive amplifier in the motor driver or the motor specification (type).

The detecting circuit 103 is so configured that the A/D converter (for converting an analog signal into a digital signal) 51 is supplied with the AC voltage generated across the resistor R1 in the series circuit of the resistor R1 and the capacitor C2 inserted between the negative line 5 of the DC link and the ground G2. Also, the detecting circuit 103 includes a microprocessor 52 and a memory 53, and the voltage signal converted into a digital signal by the A/D converter 51 is input to the microprocessor 52.

The memory 53 has stored therein beforehand a reference value indicating the insulation deterioration of the motor in accordance with the specification (type) of the motor drive amplifier 8 used in the motor driver or the motor specification (type). The controller 9 of the motor drive amplifier 8 includes a memory for storing the specification (type) of the motor drive amplifier 8 or the motor specification (type).

The control unit 11 reads the specification (type) of the motor drive amplifier from the controller 9 of the motor drive amplifier 8, and transmits it to the microprocessor 52 of the detecting circuit 103. The microprocessor 52 reads a reference value corresponding to the specification (type) of the motor drive amplifier or the motor specification (type) from the memory 53 and uses the reference value to detect the insulation deterioration.

The DC voltage detected by rectifying the high-frequency voltage across the resistor R1 in the rectifying circuit 21 is converted into a digital signal by the A/D converter 31. The microprocessor 32 compares the detected voltage value converted into the digital signal with a reference value, and in the case where the detected voltage increases beyond the reference value, transmits a signal indicating the insulation resistance decrease to the control unit 11. The control unit 11, upon receipt of this signal, displays on the display 12 that the insulation resistance has decreased.

As an alternative, in response to the instruction from the control unit 11, the microprocessor 52 stores the detected voltage value output from the A/D converter 51 in the memory 53, while at the same time transmitting the detected voltage value to the control unit 11. The detected voltage value is thus displayed on the display 12 of the control unit 11 to indicate the fact that the insulation resistance has decreased. As another alternative, an instruction to store and indicate the detected voltage value periodically is issued from the control unit 11 (for example, the operator inputs and stores the instruction in the control unit 11 and outputs a display instruction to the microprocessor 32 at regular intervals, for example, once a month). The detected voltage value output to the microprocessor 52 from the A/D converter 51 is stored in the memory 53. At the same time, all the data on the detected voltage differences stored in the memory 33 or a plurality of data including the current data and the immediately preceding data or the data on several previous occasions are transmitted to and displayed on the display 12. In this way, the history of the insulation resistance against the ground is displayed and, therefore, the progress of the insulation deterioration can be known.

As yet another alternative, the detected voltage value output from the A/D converter 51 in the initial stage of operation (when the insulation deterioration is not yet caused) of the motor driver 3 and the motor M are stored as a first reference value in the memory 53 using the detecting circuit 103. At the same time, the difference between the first reference value and a known value of the motor insulation deterioration is stored as a second reference value in the memory 53. The microprocessor 52 determines the difference between each of the sequentially detected subsequent voltage values and the first reference value, and when the difference exceeds the second reference value, determines it as an insulation deterioration. Thus, an alarm signal against the insulation deterioration is transmitted to the control unit 11 and displayed on the display 12. In this way, the insulation deterioration from the initial stage of operation can be accurately known.

According to the embodiment described above, the series circuit of the resistor R1 and the capacitor C2 is connected to the negative line 5 of the DC link and the apparatus is grounded at G2. As an alternative, the series circuit of the resistor R1 and the capacitor C2 is connected to the positive line 4, and the apparatus is grounded through the series circuit. Further, both the lines 4, 5 may be connected to the resistor-capacitor series circuit, through which the apparatus may be grounded.

Furthermore, in place of the resistor-capacitor series circuit, a capacitor may be inserted between the line 4 and/or the line 5 and the ground G2 as shown in FIG. 2, and a current sensor such as a Hall element for detecting the current flowing in the capacitor may be arranged to detect the high-frequency noise in the capacitor. This detected voltage is rectified and converted into a DC voltage and, as in the embodiments described above, the motor insulation resistance and the deterioration thereof are detected.

Figure 6:
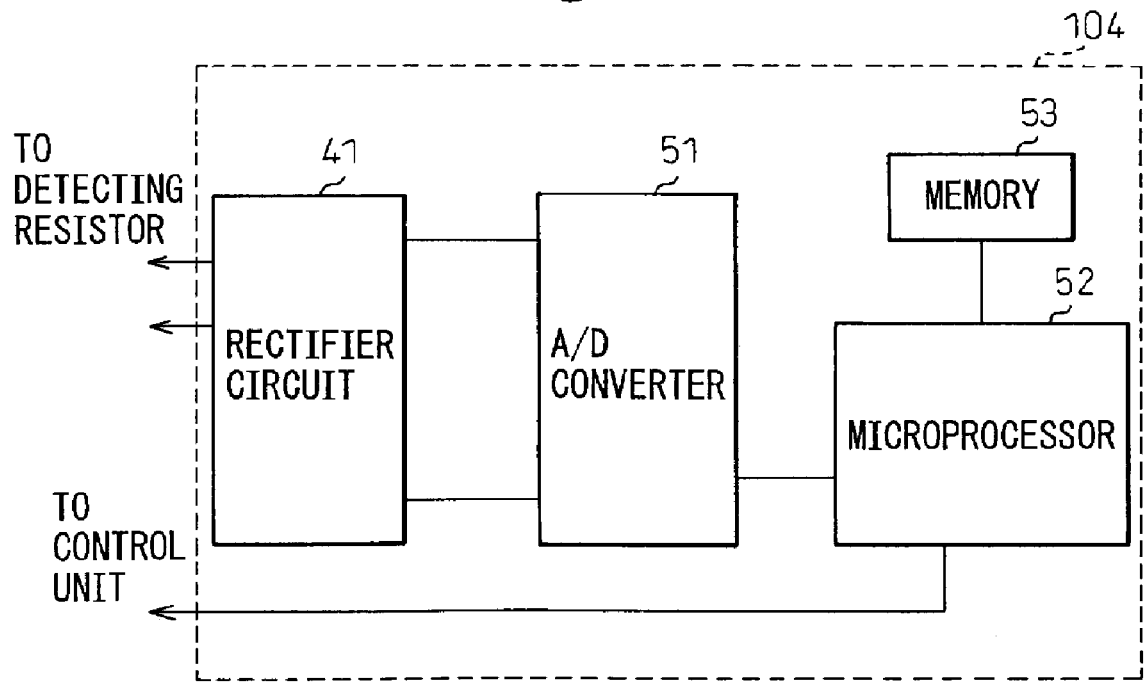
FIG. 6 shows yet another example of the circuit diagram of a detecting circuit according to the embodiment of FIG. 1 or 2.

FIG. 6 is a block diagram showing still another example of the circuit diagram of the detecting circuit according to an embodiment of the invention. The detecting circuit 104 shown in FIG. 6 is different from that in FIG. 5 in that a rectifying circuit 41 is added in the circuit of FIG. 4. The AC voltage generated across the resistor R1 in the series circuit of the resistor R1 and the capacitor C2 connected between the negative line 5 of the DC link and the ground G is input to and rectified in the rectifying circuit 41 and then converted into a digital signal by the A/D converter 51. The other configuration and operation are similar to those of the detecting circuit 103 shown in FIG. 5 and therefore not described.

It should be noted that the present invention is not limited by the above-described embodiments but various modifications are possible without departing the scope of claims. The terms used in claims are not limited to the specific meanings of the terms used in the description of the embodiments.

What is claimed is:

1. A motor driver comprising:
a power supply unit including a first rectifying circuit rectifying the voltage supplied from an AC power supply and a capacitor smoothing the rectified voltage, and a motor drive amplifier driving a motor by converting the output voltage of the power supply unit into an AC voltage of a frequency to drive the motor;
a plurality of elements each being configured of a capacitor and a resistor connected in series with each other, and being connected between at least one of the positive electrode and the negative electrode of the output line of the power supply unit and the ground; and
an insulation deterioration detecting circuit having a voltage detecting circuit detecting the voltage across the resistor and detecting at least one of the voltage between the elements and the current flowing in the elements.

2. A motor driver according to claim 1,
wherein the voltage detecting circuit includes a comparator comparing the detected voltage with a reference voltage, and a fault is displayed on a display unit in the case where the detected voltage exceeds the reference voltage.

3. A motor driver according to claim 1,
wherein the voltage detecting circuit includes a second rectifying circuit converting the detected voltage of a DC voltage with respect to the ground and a comparator comparing the output voltage of the second rectifying circuit with a reference voltage, and a fault is displayed on a display unit in the case where the output voltage of the second rectifying circuit exceeds the reference voltage.

4. A motor driver according to claim 1,
wherein the voltage detecting circuit includes an A/D converter converting the detected voltage into a digital signal and a processor causing the display unit to display a fault in the case where the voltage converted by the A/D converter exceeds a predetermined value.

5. A motor driver according to claim 4,
wherein the voltage detecting circuit includes a memory storing the detected voltage, and the processor causes the display unit to display a plurality of detected voltage values stored in the memory.

6. A motor driver according to claim 5,
wherein the memory stores a reference voltage value for the specification of at least one of the motor and the motor drive amplifier, and the processor causes the display unit to display a fault in the case where the detected voltage value exceeds the reference voltage value.

7. A motor driver according to claim 5,
wherein the memory stores, as a first reference value, the detected voltage value output from the A/D converter while no insulation fault occurs in the motor driver and the motor, and also stores, as a second reference value, the voltage value indicating the insulation deterioration of the motor driver and the motor, the processor causing the display unit to display a fault in the case where the difference between the voltage value output from the A/D converter and the first reference value exceeds the second reference value.

8. A motor driver according to claim 1,
wherein the voltage detecting circuit includes a second rectifying circuit converting the detected voltage into a DC voltage with respect to the ground, an A/D converter converting the detected voltage into a digital signal and a processor causing the display unit to display a fault in the case where the voltage converted by the A/D converter exceeds a predetermined value.

9. A motor driver according to claim 8,
wherein the voltage detecting circuit includes a memory storing the detected voltage, and the processor causes the display unit to display a plurality of detected voltage values stored in the memory.

10. A motor driver according to claim 9,
wherein the memory stores a reference voltage value for the specification of at least one of the motor and the motor drive amplifier, and the processor causes the display unit to display a fault in the case where the detected voltage value exceeds the reference voltage value.

11. A motor driver according to claim 9,
wherein the memory stores, as a first reference value, the detected voltage value output from the A/D converter while no insulation fault occurs in the motor driver and the motor, and also stores, as a second reference value, the voltage value indicating the insulation deterioration of the motor driver and the motor, the processor causing the display unit to display a fault in the case where the difference between the voltage value output from the A/D converter and the first reference value exceeds the second reference value.

12. A motor driver comprising:
a power supply unit including a first rectifying circuit rectifying the voltage supplied from an AC power supply and a capacitor smoothing the rectified voltage, and a motor drive amplifier driving a motor by converting the output voltage of the power supply unit into an AC voltage of a frequency to drive the motor;
a plurality of elements each being configured of a capacitor and a current sensor connected in series to the capacitor detecting the voltage proportional to the current flowing in the capacitor, and being connected between at least one of the positive electrode and the negative electrode of the output line of the power supply unit and the ground: and
an insulation deterioration detecting circuit having a voltage detecting circuit detecting the output voltage of the current sensor detecting at least one of the voltage between the elements and the current flowing in the elements.

13. A motor diver according to claim 12,
wherein the voltage detecting circuit includes a comparator comparing the detected voltage with a reference voltage, and a fault is display unit in the case where the detected voltage exceeds the reference voltage.

14. A motor driver according to claim 12,
wherein the voltage detecting circuit includes a second rectifying circuit converting the detected voltage to a DC voltage with respect to the ground and a comparator comparing the output voltage of the second rectifying circuit with a reference voltage, and a fault is displayed on a display unit in the case where the output voltage of the second rectifying circuit exceeds the reference voltage.

15. A motor driver according to claim 12,
wherein the voltage detecting circuit includes an A/D converter converting the detected voltage into a digital signal and a processor causing the display unit to display a fault in the case where the voltage converted by the A/D converter exceeds a predetermined value.

16. A motor driver according to claim 15,
wherein the voltage detecting circuit includes a memory storing the detected voltage, and the processor causes the display unit to display a plurality of detected voltage values stored in the memory.

17. A motor driver according to claim 16,
wherein the memory stores a reference voltage value for the specification of at least one of the motor and the motor drive amplifier, and the processor causes the display unit to display a fault in the case where the detected voltage value exceeds the reference voltage value.

18. A motor driver according to claim 16,
wherein the memory stores, as a first reference value, the detected voltage value output from the A/D converter while no insulation fault occurs in the motor driver and the motor, and also stores, as a second reference value, the voltage value indicating the insulation deterioration of the motor driver and the motor, the processor causing the display unit to display a fault in the case where the difference between the voltage value output from the A/D converter and the first reference value exceeds the second reference value.

19. A motor driver according to claim 12,
wherein the voltage detecting circuit includes a second rectifying circuit converting the detected voltage into a DC voltage with respect to the ground, an A/D converter converting the detected voltage into a digital signal and a processor causing the display unit to display a fault in the case where the voltage converted by the A/D converter exceeds a predetermined value.

20. A motor driver according to claim 19,
wherein the voltage detecting circuit includes a memory storing the detected voltage, and the processor causes the display unit to display a plurality of detected voltage values stored in the memory.

21. A motor driver according to claim 20,
wherein the memory stores a reference voltage value for the specification of at least one of the motor and the motor drive amplifier, and the processor causes the display unit to display a fault in the case where the detected voltage value exceeds the reference voltage value.

22. A motor driver according to claim 20,
wherein the memory stores, as a first reference value, the detected voltage value output from the A/D converter while no insulation fault occurs in the motor driver and the motor, and also stores, as a second reference value, the voltage value indicating the insulation deterioration of the motor driver and the motor, the processor causing the display unit to display a fault in the case where the difference between the voltage value output from the A/D converter and the first reference value exceeds the second reference value.

* * * * *